(12) United States Patent
Gai et al.

(10) Patent No.: US 9,876,191 B2
(45) Date of Patent: Jan. 23, 2018

(54) OLED PANEL, PACKAGING METHOD THEREOF, AND A DISPLAY DEVICE

(71) Applicants: BOE TECHNOLOGY GROUP CO., LTD., Beijing (CN); Ordos Yuansheng Optoelectronics Co., Ltd., Ordos, Inner Mongolia (CN)

(72) Inventors: Renrong Gai, Beijing (CN); Weilin Lai, Beijing (CN)

(73) Assignees: BOE TECHNOLOGY GROUP CO., LTD., Beijing (CN); ORDOS YUANSHENG OPTOELECTRONICS, CO., LTD., Ordos, Inner Mongolia (CN)

( * ) Notice: Subject to any disclaimer, the term of this patent is extended or adjusted under 35 U.S.C. 154(b) by 0 days.

(21) Appl. No.: 15/159,201

(22) Filed: May 19, 2016

(65) Prior Publication Data

US 2017/0062759 A1    Mar. 2, 2017

(30) Foreign Application Priority Data

Sep. 1, 2015   (CN) .......................... 2015 1 0552569

(51) Int. Cl.
*H01L 51/52*     (2006.01)
*H01L 23/08*     (2006.01)

(52) U.S. Cl.
CPC .......... *H01L 51/5246* (2013.01); *H01L 23/08* (2013.01); *H01L 51/525* (2013.01); *H01L 2251/558* (2013.01); *H01L 2251/566* (2013.01)

(58) Field of Classification Search
CPC ...... H01L 23/08; H01L 51/5246; H01L 51/56
See application file for complete search history.

(56) References Cited

U.S. PATENT DOCUMENTS

| | | | |
|---|---|---|---|
| 2007/0132382 A1* | 6/2007 | Lee | G02F 1/1339 313/512 |
| 2007/0170423 A1* | 7/2007 | Choi | C03C 8/24 257/40 |
| 2007/0232182 A1* | 10/2007 | Park | H01L 51/5246 445/25 |

(Continued)

FOREIGN PATENT DOCUMENTS

| | | |
|---|---|---|
| CN | 101257015 A | 9/2008 |
| CN | 104167426 A | 11/2014 |

OTHER PUBLICATIONS

First Office Action dated Aug. 2, 2017 corresponding to Chinese application No. 201510552569.3.

*Primary Examiner* — Allan R Wilson
(74) *Attorney, Agent, or Firm* — Nath, Goldberg & Meyer; Joshua B. Goldberg; Annie Kock

(57) ABSTRACT

The present invention provides an OLED panel, a packaging method thereof and a display device. The OLED panel includes a packaging coverplate and an OLED substrate opposite to each other, the OLED substrate having a display area and a packaging area surrounding the display area; and glass glue provided between the packaging coverplate and the OLED substrate and corresponding to the packaging area, and the OLED panel further includes a support structure provided at a side of the glass glue away from the display area, the support structure being used for supporting the packaging coverplate and the OLED substrate when cutting a display motherboard to form the OLED panel.

19 Claims, 2 Drawing Sheets

(56) References Cited

U.S. PATENT DOCUMENTS

| | | | |
|---|---|---|---|
| 2010/0171416 A1* | 7/2010 | Lee | H01L 51/525 313/504 |
| 2012/0319092 A1* | 12/2012 | Shimomura | B32B 37/06 257/40 |
| 2013/0313528 A1 | 11/2013 | So et al. | |
| 2014/0322827 A1* | 10/2014 | Su | H01L 51/56 438/3 |
| 2015/0214502 A1* | 7/2015 | Sato | H01L 51/525 257/88 |
| 2016/0276618 A1* | 9/2016 | Sun | H01L 51/0029 |
| 2016/0293688 A1* | 10/2016 | Chen | H01L 27/3279 |
| 2017/0141350 A1* | 5/2017 | Wang | H01L 51/5246 |

* cited by examiner

OLED PANEL, PACKAGING METHOD THEREOF, AND A DISPLAY DEVICE

CROSS-REFERENCE TO RELATED APPLICATION

This application claims priority to Chinese Patent Application No. 201510552569.3, filed on Sep. 1, 2015, the contents of which are incorporated by reference in the entirety.

FIELD OF THE INVENTION

The present invention belongs to the field of display technology, and particularly relates to an OLED panel, a packaging method thereof, and a display device including the OLED panel.

BACKGROUND OF THE INVENTION

Organic light-emitting diode (OLED) display devices, as a new type of flat-panel displays, draw more and more attention and become the next generation display devices likely to replace liquid crystal display devices, due to their characteristics such as self-illumination, high brightness, wide viewing angle, fast response, low power consumption, flexibility, etc.

Currently, a packaging method of an OLED panel is as follows: placing an OLED substrate including a plurality of display areas on a platform of a laminating machine; coating a UV glue for one or two rounds in a packaging region of a packaging coverplate to be attached to the OLED substrate (the packaging region being positioned in the peripheral area of the packaging coverplate), and coating glass frit on parts of the packaging coverplate each corresponding to a packaging area surrounding each display area; next, attaching the packaging coverplate to the OLED substrate under vacuum to form an OLED display motherboard; subsequently, irradiating the peripheral area of the packaging coverplate with a UV light under atmospheric environment, so as to cure the UV glue in the packaging region of the packaging coverplate; and then irradiating the areas coated with the glass frit with laser, so as to melt and cure the glass frit, thus completing packaging of the OLED display motherboard. After the packaging is completed, a mechanical cutter is used to cut along the packaging areas of the OLED display motherboard, so as to form a plurality of OLED panels.

The inventors found that at least the following problem exists in the prior art: the main component of the glass frit is glass powder, ceramic powder, etc., and the glass frit becomes fragile after being melt and cured by laser, therefore, when cutting the OLED motherboard, pressing and edge grinding by the mechanical cutter are likely to result in release of inner stress of the glass frit, which causes the glass frit to crack and even causes the packaging coverplate to separate from the OLED substrate, so that water and oxygen invade into an OLED device via the cracking path, which leads to black spots and bubbles in the light-emitting layer of the OLED device, finally resulting in failure of the device and shortened service life. Therefore, there is always a certain distance kept between the cutting line and the glass frit, which, however, is unfavourable for implementation of narrow bezel as the edge for grinding has limited width.

SUMMARY OF THE INVENTION

An object of the present disclosure is to provide an OLED panel capable of reducing or preventing cracking of glass glue, a packaging method thereof and a display device, in order to alleviate or solve the above problem occurring when cutting an existing OLED motherboard.

According to one aspect of the present invention, there is provided an OLED panel, including a packaging coverplate and an OLED substrate opposite to each other, the OLED substrate having a display area and a packaging area surrounding the display area; and glass glue provided between the packaging coverplate and the OLED substrate and corresponding to the packaging area, and the OLED panel further includes a support structure provided at a side of the glass glue away from the display area, the support structure being used for supporting the packaging coverplate and the OLED substrate when cutting a display motherboard to form the OLED panel.

Optionally, the support structure is provided on the OLED substrate.

Optionally, the support structure is made of an elastic material.

Further optionally, the OLED substrate is provided thereon with spacers, and the spacers and the support structure are arranged in the same layer and made of the same material.

Further optionally, height of the support structure is lower than that of the spacers by 0.3 μm to 0.7 μm.

Optionally, the support structure includes a plurality of support pillars spaced apart from each other and arranged to surround the display area.

Further optionally, gaps between adjacent support pillars are filled with sealant.

According to another aspect of the present invention, there is provided a packaging method of an OLED panel, wherein the OLED panel includes a packaging coverplate and an OLED substrate opposite to each other, the OLED substrate has a display area and a packaging area surrounding the display area, and the packaging method includes steps of:

forming a support structure on an area of the packaging coverplate corresponding to the packaging area or on the packaging area of the OLED substrate; and forming glass glue on the area of the packaging coverplate corresponding to the packaging area and/or on the packaging area of the OLED substrate, such that the support structure is positioned at a side of the glass glue away from the display area after the packaging coverplate and the OLED substrate are assembled.

Optionally, the support structure is formed on the OLED substrate.

Optionally, the support structure is made of an elastic material.

Further optionally, patterns of spacers are formed while forming the support structure on the OLED substrate.

Further optionally, height of the support structure is lower than that of the spacers by 0.3 μm to 0.7 μm.

Optionally, the support structure includes a plurality of support pillars spaced apart from each other and arranged to surround the display area.

Further optionally, the packaging method further includes a step of:

dispensing sealant between every two adjacent support pillars on the OLED substrate.

As still another aspect of the present invention, there is provided a display device, including the above OLED panel.

The beneficial effects of the present invention are as follow.

In the OLED panel provided by the present invention, the support structure is provided at the side of the glass glue away from the display area, that is, the support structure is provided between the glass glue and a cutting line, therefore, the support structure has a certain supporting effect on the packaging coverplate and the packaging area of the OLED substrate when cutting an OLED motherboard along the cutting line, so as to alleviate or prevent the phenomenon that deformation occurs in the process of cutting the packaging coverplate and the OLED substrate to cause the glass glue to crack and thus to allow pollutants such as moisture, oxygen, impurity, etc., to enter into the display area of the OLED panel along the cracking path, and then light-emitting material of the OLED device in the OLED panel is prevented from being polluted.

DETAILED DESCRIPTION OF THE EMBODIMENTS

In order that those skilled in the art can better understand the technical solutions of the present invention, the present invention will be further described in detail below in conjunction with the accompanying drawings and specific implementations.

Figure 1:
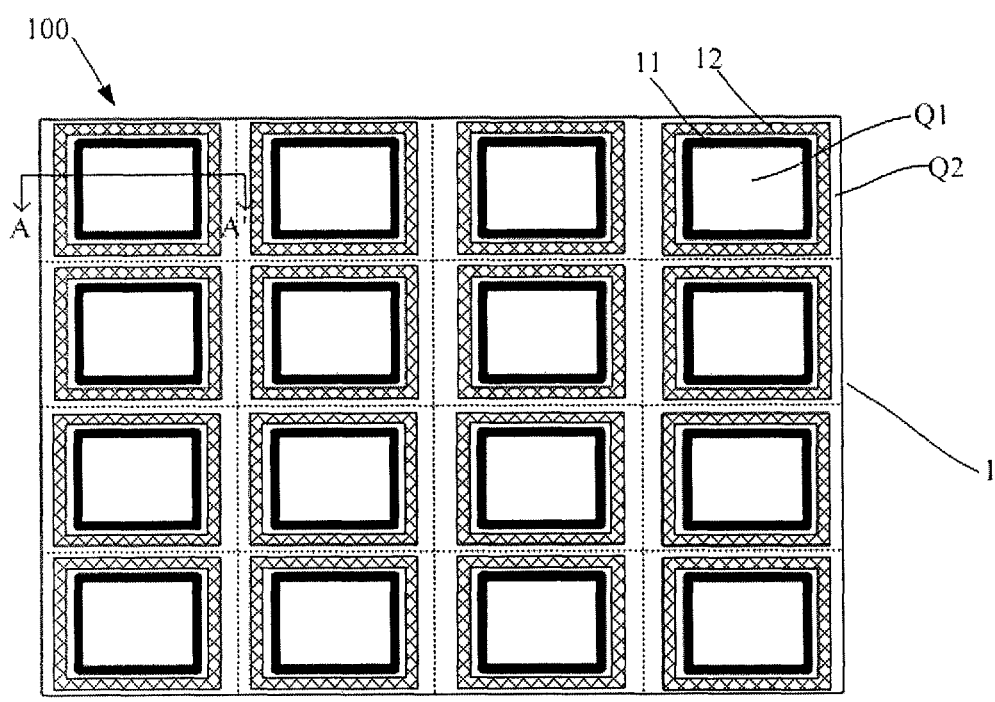
FIG. 1 is a schematic diagram illustrating distribution of OLED panels on an OLED motherboard provided by an embodiment of the present invention.
Figure 2:
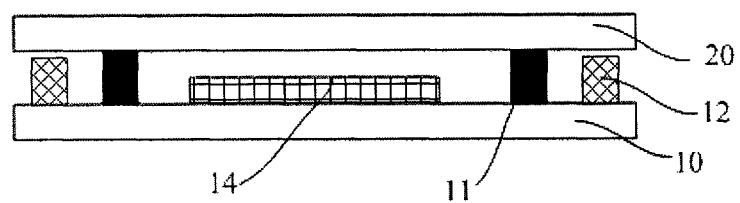
FIG. 2 is a cross-sectional view taken along line A-A' in FIG. 1.

Embodiments of the present invention provide an OLED panel 100. As shown in FIGS. 1 and 2, the OLED panel 100 includes a packaging coverplate 20 and an OLED substrate 10 opposite to each other, the OLED substrate 10 has a display area Q1 and a packaging area Q2 surrounding the display area Q1, and the OLED panel 100 further includes glass glue 11 provided between the packaging coverplate 20 and the OLED substrate 10 and corresponding to the packaging area Q2, and a support structure 12 provided at a side of the glass glue 11 away from the display area Q1, the support structure 12 is used for supporting the packaging coverplate 20 and the OLED substrate 10 when cutting an OLED motherboard 1 to form the OLED panel 100.

Those skilled in the art may understand that, the OLED panel 100 is obtained by cutting the OLED motherboard 1 along cutting lines by using a cutter. In the OLED panel 100 of the embodiments, the support structure 12 is provided at the side of the glass glue 11 away from the display area Q1, that is, the support structure 12 is provided between the glass glue 11 and the cutting line, therefore, the support structure 12 can have a certain supporting effect on the packaging coverplate 20 and the packaging area Q2 of the OLED substrate 10 when cutting the OLED motherboard 1 along the cutting line, so as to alleviate or prevent the phenomenon that deformation occurs in the process of cutting the packaging coverplate 20 and the OLED substrate 10 to cause the glass glue 11 to crack and thus to allow pollutants such as moisture, oxygen, impurity, etc., to enter into the display area Q1 of the OLED substrate 10 along the cracking path, and then light-emitting material of the OLED device 14 in the OLED panel 100 is prevented from being polluted.

In some embodiments, the support structure 12 is provided on the OLED substrate 10. The support structure 12 may be made of an elastic material, so that the stress released inside the glass glue can be better absorbed. Generally, the OLED substrate 10 is provided thereon with spacers for maintaining a distance between the OLED substrate 10 and the packaging coverplate 20, so as to maintain the cell thickness. Therefore, in some embodiments, the support structure 12 and the spacers are provided in the same layer and made of the same material. In this way, patterns of the support structure 12 and the spacers can be formed by one patterning process, without adding process steps. Further, the height of the support structure 12 is slightly smaller than that of the spacers, for example, the height of the support structure 12 may be smaller than that of the spacers by 0.3 μm to 0.7 μm. That is to say, one end of the support structure 12 is arranged on the OLED substrate 10 and the other end of the support structure 12 is not in contact with the packaging coverplate 20. The relationship between heights of the support structure 12 and the spacers is not limited to the above, as long as it can be ensured that the distance between the support structure 12 and the packaging coverplate 20 is smaller than the largest deformation amount that the OLED substrate 10 and the packaging coverplate 20 can bear during the cutting process, and in this way, the problem that the glass glue 11 between the OLED substrate 10 and the packaging coverplate 20 cracks in the cutting process can be prevented. Furthermore, the height of the support structure 12 is smaller than that of the spacers, which can prevent the packaging coverplate 20 from warping in the cutting process.

Figure 3:
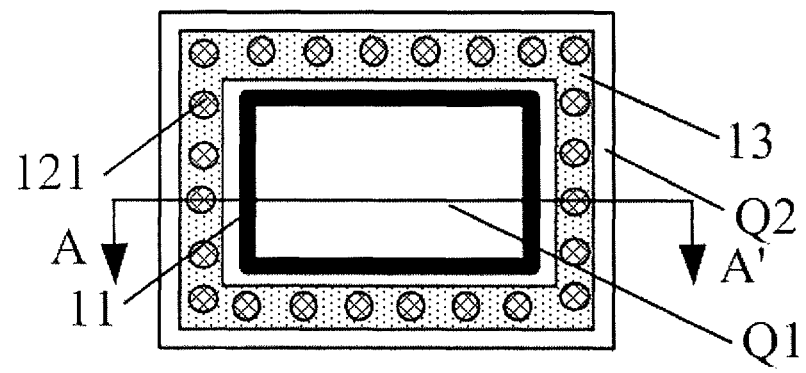
FIG. 3 is a schematic diagram of an OLED panel provided by an embodiment of the present invention.
Figure 4:
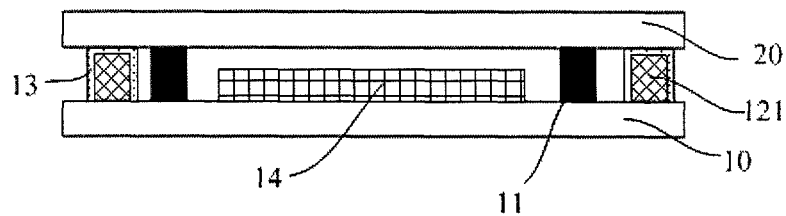
FIG. 4 is a cross-sectional view taken along line A-A' in FIG. 3.

In some embodiments, the support structure 12 may include a plurality of support pillars 121 spaced apart from each other and arranged to surround the display area Q1, as shown in FIGS. 3 and 4. Needless to say, the support structure 12 may have a ring-like pattern surrounding the display area Q1 (obviously, the support structure 12 also surrounds the glass glue 11), and the shape of the support structure 12 is not specifically limited in the embodiments. In the case where the support structure 12 includes a plurality of support pillars 121, the gap between adjacent support pillars 121 may be filled with sealant 13 (UV glue), which can further prevent the pollutants such as moisture, oxygen, etc., from entering into the display area Q1 of the OLED substrate 10.

According to another aspect of the present invention, there is provided a packaging method of an OLED panel 100, the OLED panel 100 may be the above-described OLED panel, and the packaging method includes steps of:

forming a support structure 12 on an area of the packaging coverplate 20 corresponding to the packaging area Q2 or on the packaging area Q2 of the OLED substrate 10; and forming glass glue 11 on the area of the packaging coverplate 20 corresponding to the packaging area Q2 and/or on the packaging area Q2 of the OLED substrate 10, such that the support structure 12 is positioned at a side of the glass glue 11 away from the display area Q1 after the packaging coverplate 20 and the OLED substrate 10 are assembled.

Referring to FIGS. 1 to 5, the packaging method may include the steps as follows.

At step 1, a support structure 12 is formed in the packaging area Q2 of the OLED substrate 10. It can be understood that, known components such as thin film transistors, OLED devices 14, spacers and the like are also formed on the OLED substrate 10.

In some embodiments, the spacers and the support structure 12 may be formed by one patterning process. In addition, the height of the support structure 12 is slightly smaller than that of the spacers, for example, the height of the support structure 12 may be smaller than that of the spacers by 0.3 μm to 0.7 μm. That is to say, one end of the support structure 12 is arranged on the OLED substrate 10 and the other end of the support structure 12 is not in contact with the packaging coverplate 20. The relationship between heights of the support structure 12 and the spacers are not limited to the above, as long as it can be ensured that the distance between the support structure 12 and the packaging coverplate 20 after assembly is smaller than the largest deformation amount that the OLED substrate 10 and the packaging coverplate 20 can bear during the cutting process, and in this way, the problem that the glass glue 11 between the OLED substrate 10 and the packaging coverplate 20 cracks in the cutting process can be prevented. Furthermore, the height of the support structure 12 is smaller than that of the spacers, which can prevent the packaging coverplate 20 from warping in the cutting process.

Figure 5:
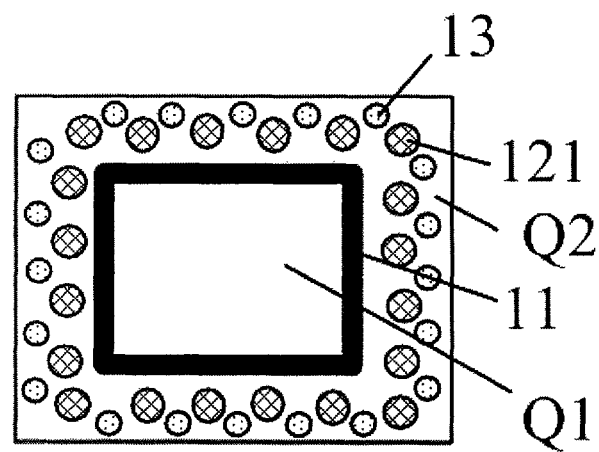
FIG. 5 is a schematic diagram of another OLED substrate provided by an embodiment of the present invention.

In some embodiments, the support structure 12 may include a plurality of support pillars 121 spaced apart from each other and arranged to surround the display area Q1. Needless to say, the support structure 12 may have a ring-like pattern surrounding the display area Q1, and the shape of the support structure 12 is not specifically limited in the embodiments. In the case where the support structure 12 includes a plurality of support pillars 121, the packaging method of the embodiments further includes a step of: dispensing sealant 13 (UV glue) in every gap between adjacent support pillars 121 in a dotted manner, as shown in FIG. 5. It can be understood that when the packaging area Q2 is irradiated with laser after assembly, the dotted sealant 13 will diffuse to fill the gaps between the support pillars 121, so that the pollutants such as moisture, oxygen, etc., can be further prevented from entering into the display area Q1 of the OLED substrate 10.

At step 2, glass frit (material of the glass glue 11) is coated on the area of the packaging coverplate 20 corresponding to the packaging area Q2 of the OLED substrate 10. Here, after the packaging coverplate 20 and the OLED substrate 10 are assembled, the glass frit is positioned at a side of the support pillars 121 close to the display area Q1. Needless to say, the glass frit may be directly coated on the packaging area Q2 of the OLED substrate 10, and is positioned at the side of the support pillars 121 close to the display area Q1. Alternatively, the glass frit may be coated on both the packaging coverplate 20 and the OLED substrate 10, which is not limited in the present invention.

At step 3, the packaging coverplate 20 and the OLED substrate 10 are assembled, and the packaging area Q2 is irradiated with laser to turn the glass frit into glass glue, thus forming an OLED motherboard 1.

At step 4, the OLED motherboard 1 is cut to form the OLED panel 100.

Those skilled in the art can understand that, the OLED panel 100 is obtained by cutting the OLED motherboard 1 along cutting lines by using a cutter. In the OLED panel 100 of the embodiments, the support structure 12 is provided at the side of the glass glue 11 away from the display area Q1, that is, the support structure 12 is provided between the glass glue 11 and the cutting line, therefore, the support structure 12 can have a certain supporting effect on the packaging coverplate 20 and the packaging area Q2 of the OLED substrate 10 when cutting the OLED motherboard 1 along the cutting line, so as to alleviate or prevent the phenomenon that deformation occurs in the process of cutting the packaging coverplate 20 and the OLED substrate 10 to cause the glass glue 11 to crack and thus to allow pollutants such as moisture, oxygen, impurity, etc., to enter into the display area Q1 of the OLED substrate 10 along the cracking path, and then light-emitting material of the OLED device 14 in the OLED panel 100 is prevented from being polluted. Moreover, the packaging method of the embodiments may further shorten the distance between the cutting line and the display area Q1, which is favorable for implementation of narrow bezel.

It should be noted that, specific sequence in which the steps of forming the OLED substrate 10 and forming the packaging coverplate 20 are performed is not limited, the above description is given by taking a case in which the step of forming the OLED substrate 10 is performed firstly as an example, but the embodiments are not limited thereto.

As still another aspect of the present invention, there is provided a display device, which includes the above OLED panel 100.

The display device may be any product or component having a display function such as a liquid crystal panel, electronic paper, a mobile phone, a tablet computer, a television, a display, a notebook computer, a digital photo frame, a navigator or the like.

It could be understood that the above implementations are merely exemplary implementations adopted for describing the principle of the disclosure, but the disclosure is not limited thereto. For those of ordinary skill in the art, various variations and improvements may be made without departing from the spirit and essence of the disclosure, and these variations and improvements shall also be regarded as falling into the protection scope of the disclosure.

The invention claimed is:

1. An OLED panel, comprising:
   a packaging coverplate and an OLED substrate opposite to each other, the OLED substrate having a display area and a packaging area surrounding the display area;
   glass glue provided between the packaging coverplate and the OLED substrate and corresponding to the packaging area; and
   a support structure provided at a side of the glass glue away from the display area, the support structure being used for supporting the packaging coverplate and the OLED substrate when cutting a display motherboard to form the OLED panel, wherein the support structure is in contact with only one of the packaging coverplate and the OLED substrate.

2. The OLED panel according to claim 1, wherein the support structure is provided on the OLED substrate.

3. The OLED panel according to claim 2, wherein the support structure is made of an elastic material.

4. The OLED panel according to claim 3, wherein the OLED substrate is provided thereon with spacers, and the spacers and the support structure are arranged in the same layer and made of the same material.

5. The OLED panel according to claim 4, wherein height of the support structure is lower than that of the spacers by 0.3 μm to 0.7 μm.

6. The OLED panel according to claim 1, wherein the support structure comprises a plurality of support pillars spaced apart from each other and arranged to surround the display area.

7. The OLED panel according to claim 5, wherein the support structure comprises a plurality of support pillars spaced apart from each other and arranged to surround the display area.

8. The OLED panel according to claim 6, wherein gaps between adjacent support pillars are filled with sealant.

9. The OLED panel according to claim 7, wherein gaps between adjacent support pillars are filled with sealant.

10. A display device, comprising the OLED panel according to claim 1.

11. A packaging method of an OLED panel, wherein the OLED panel comprises a packaging coverplate and an OLED substrate opposite to each other, the OLED substrate has a display area and a packaging area surrounding the display area, and the packaging method comprises steps of:
   forming a support structure on an area of the packaging coverplate corresponding to the packaging area or on the packaging area of the OLED substrate; and
   forming glass glue on the area of the packaging coverplate corresponding to the packaging area and/or on the packaging area of the OLED substrate, such that the support structure is positioned at a side of the glass glue away from the display area and in contact with only one of the packaging coverplate and the OLED substrate after the packaging coverplate and the OLED substrate are assembled.

12. The packaging method according to claim 11, wherein the support structure is formed on the OLED substrate.

13. The packaging method according to claim 11, wherein the support structure is made of an elastic material.

14. The packaging method according to claim 13, wherein patterns of spacers are formed while forming the support structure on the OLED substrate.

15. The packaging method according to claim 14, wherein height of the support structure is lower than that of the spacers by 0.3 $\mu$m to 0.7 $\mu$m.

16. The packaging method according to claim 11, wherein the support structure comprises a plurality of support pillars spaced apart from each other and arranged to surround the display area.

17. The packaging method according to claim 15, wherein the support structure comprises a plurality of support pillars spaced apart from each other and arranged to surround the display area.

18. The packaging method according to claim 16, further comprising a step of:
   dispensing sealant between every two adjacent support pillars on the OLED substrate.

19. The packaging method according to claim 17, further comprising a step of:
   dispensing sealant between every two adjacent support pillars on the OLED substrate.

* * * * *